United States Patent [19]
Nakamura

[11] Patent Number: 5,894,439
[45] Date of Patent: Apr. 13, 1999

[54] MEMORY DEVICE

[75] Inventor: Kazuo Nakamura, Tokyo, Japan

[73] Assignee: Mitsubishi Denki Kabushiki Kaisha, Tokyo, Japan

[21] Appl. No.: 08/951,338

[22] Filed: Oct. 17, 1997

[30] Foreign Application Priority Data

May 28, 1997 [JP] Japan ................. 9-138976

[51] Int. Cl.$^6$ ................................. G11C 7/00
[52] U.S. Cl. ...................... 365/189.07; 365/185.21
[58] Field of Search ............. 365/189.08, 189.07, 365/207, 208, 185.17, 185.21; 327/53, 59, 66

[56] References Cited

U.S. PATENT DOCUMENTS

| | | | |
|---|---|---|---|
| 4,092,735 | 5/1978 | McElroy | 365/222 |
| 4,375,600 | 3/1983 | Wu | 365/205 |
| 5,247,483 | 9/1993 | Okamoto | 365/205 |
| 5,798,960 | 8/1998 | Hughes | 365/233 |

FOREIGN PATENT DOCUMENTS

| | | |
|---|---|---|
| 4-238197 | 8/1992 | Japan . |
| 7-192489 | 7/1995 | Japan . |

*Primary Examiner*—Tan T. Nguyen
*Attorney, Agent, or Firm*—Burns, Doane, Swecker & Mathis, LLP

[57] ABSTRACT

In a memory device employing a memory sense amplifier of the grounded-gate type, by putting a word line in an active state from a point of time in a precharge period, a high-speed operation can be implemented with no increase in access time due to a lagging change of the electric potential at the gate of the grounded-gate transistor because of an effect of a wire resistance. In addition, by lowering the electric-potential of the gate of the grounded-gate transistor using a current-mirror circuit, low power consumption can be realized.

8 Claims, 9 Drawing Sheets

1

MEMORY DEVICE

BACKGROUND OF THE INVENTION

1. Field of the Invention

The present invention relates to a memory device and, in particular, to a sense amplifier employed in a semiconductor memory.

2. Description of the Prior Art

FIG. 8 is a circuit diagram showing the configuration of a memory device employing a conventional memory sense amplifier of the grounded-gate type. In the drawing, numerals T1 to T6 and T18 and T19 each denote an N-channel transistor, numerals T21 to T25 each denote a P-channel transistor, numerals I1 and I2 are each an inverter, numeral SL denotes a selector and numeral MB3 is a memory block.

FIG. 2 is a circuit diagram showing the configuration of the selector SL. In the drawing, numerals G30 to G33 each denote a NAND gate, numerals I30 to I35 are each an inverter, numerals T30 to T33 are a group of N-channel transistors having the same channel length and the same channel width and numerals T34 to T37 are another group of N-channel transistors having the same channel length and the same channel width.

FIG. 9 is a circuit diagram showing the configuration of the NOR-type memory block MB3. In the drawing, numerals G60 to G63 each denote an AND gate, numerals I40 to I41 are each an inverter, numerals C1 to C10 are memory-cell transistors having the same channel length and the same channel width, numerals C11 to C16 are other memory-cell transistors having the same channel length and the same channel width and numerals R1 to R12 are wire resistances of word lines W0 to W3. The memory-cell transistors C1 to C16 are each an N-channel transistor forming a memory cell. It should be noted that the memory-cell transistors C11 to C16 each have a threshold voltage equal to or higher than 5V so that, even with the gate voltage thereof varied in the range 0 to 5V, the drain current is smaller than 1 nA and can be said to be almost not flowing.

The operation of the memory device is explained by referring to FIGS. 2, 8 and 9 as follows.

The electric potential VDD of the power supply of the conventional memory device is about 5 V. The memory device is operative when a chip-select signal CS of the memory device shown in FIG. 8 is connected to the electric potential of the ground GND which is referred to hereafter as an "L" level. If the chip-select signal CS is connected to the electric potential VDD of the power supply which is referred to hereafter as an "H" level, on the other hand, the memory device is put in a deselected state and thus not operative. When the chip-select signal CS is put at the "L" level, the P-channel transistor T25 is turned on, pulling up the electric potentials of the sources of the P-channel transistors T24, T23 and T21 connected to the P-channel transistor T25 to the electric potential VDD which is about 5 V. The P-channel transistor T24 and the N-channel transistors T18 and T19 work as a source of voltage supplying an electric potential to the gate of the N-channel transistor T1. To put it in detail, when a current of about 200 µA flows from the drain of the P-channel transistor T24 to the N-channel transistors T18 and T19, the electric potential of the gate of the N-channel transistor T1, that is, the electric potential of a node N3, is about 2.5 V.

On the other hand, the P-channel transistor T23 and the N-channel transistors T4 to T6 work as a source of voltage supplying an electric potential to the gate of the P-channel transistor T21 which serves as a source of current supplying a current to a node N1. The N-channel transistor T4 has the same channel length and the same channel width as the N-channel transistor T1. By the same token, the N-channel transistor T5 has the same channel length and the same channel width as the N-channel transistor T30 employed in the selector SL. Likewise, the N-channel transistor T6 has the same channel length and the same channel width as the memory-cell transistor C1. On the other hand, the P-channel transistor T23 has the same channel length as the P-channel transistor T21 but the channel width of the former is five times that of the latter.

As a result, affected by the current-mirror effect, the drain current of the P-channel transistor T21 is about 150 µA which is about ⅕ of the drain current (referred to hereafter as a memory-cell drain current) of, for example, the memory-cell transistor C1 with the gate voltage thereof set at about 5 V. Since the N-channel transistor T1 is a grounded-gate amplifier, the electric potential at the node N1 is changed in accordance with the magnitude of a current drawn from a node S. The inverter I1 outputs an "L" or "H" level to a node N2 depending upon whether or not the electric potential at the node N1 is higher than a predetermined value. During a precharge period (a period in which the signal level of a clock P1 signal is set at "H"), the inverter I2 and the P-channel transistor T22 precharge one of bit lines B0 to B3 connected to the node S through the nodes N1 and S and the selector SL. The N-channel transistors T2 and T3 work as a positive feedback circuit which draws a current from the node N1, accelerating the change in electric potential when the electric potential at the node N2 changes from "L" to "H".

The inverters I30 and I31 and the NAND gates G30 to G33 employed in the selector SL shown in FIG. 2 constitute an ordinary two-to-four decoder. Depending upon the combination of the "H" or "L" levels of two address input signals A1 and A0, the output of one of the four NAND gates G30 to G33 is reset to the "L" level while the remaining three outputs are all set at the "H" level. The inverters I32 to I35 and the N-channel transistors T30 to T33 couple one of the bit lines B0 to B3 which is associated with the NAND gate reset at the "L" level to the node S. The bit line B0, B1, B2 or B3 coupled to the node S is referred to hereafter as a selected bit line. At that time, the N-channel transistors T34 to T37 reset the electric potentials of the bit lines other than the selected bit line at the ground level, that is, at 0 V.

Assume, for example, that the levels of the address input signals A1 and A0 are set at "H" and reset at "L" respectively. In this case, the output of the NAND gate G32 employed in the selector SL is reset at the "L" level which is inverted by the inverter I34 to an "H" level. As a result, the gate input of the N-channel transistor T32 is set at the "H" level, turning on the N-channel transistor T32. In this state, the bit line B2 is coupled to the node S by the conduction of the N-channel transistor T32. On the other hand, the electric potentials of the bit lines B0, B1 and B3 are pulled down to 0 V. This is because the electric potentials of the gates of the N-channel transistors T34, T35 and T37 are all set at the "H" level, turning on all the N-channel transistors T34, T35 and T37 which, in turn, couple the bit lines B0, B1 and B3 respectively to the electric potential GND of the ground.

By the same token, the inverters I40 and I41 and the AND gates G60 to G63 employed in the memory block MB3 shown in FIG. 9 constitute an ordinary two-to-four decoder with the outputs of the AND gates G60 to G63 connected to the word lines W0 to W3 respectively. Since the gates G60 to G63 are AND gates, however, one of the word lines W0 to W3 specified by the address input signals A3 and A2 is set to the "H" level while the other word lines are reset at the "L" level. The word line W0, W1, W2 or W3 specified by the address input signals A3 and A2 is referred to hereafter as a selected word line. It should be noted that, since the AND gates G60 to G63 input a clock signal P2 as a strobe signal, it is only during the "H"-level period of the clock signal P2 that the selected word line is set at the "H" level. Since the memory-cell transistors C1 to C10 turn on when the word line connected to their gate is set to the "H" level, they draw a memory-cell current from the bit line connected to the drain thereof. On the other hand, the threshold voltage of the memory-cell transistors C11 to C16 is higher than 5 V. As a result, there is no effect on the memory-cell transistors C11 to C16 even if the electric potentials of the word lines connected to their gates are changed.

Next, the operation of the memory device is explained by referring to timing charts shown in FIG. 10.

The explanation begins with a first example of a case in which the levels of the address input signals A3, A2, A1 and A0 are set at "L", "H", "L" and "L", respectively. In this case, the output of the NAND gate G30 employed in the selector SL shown in FIG. 2 is reset at the "L" level which is inverted by the inverter 132 to an "H" level. As a result, the gate input of the N-channel transistor T30 is set at the "H" level, turning on the N-channel transistor T30. In this state, the bit line B0 is the selected bit line connected to the node S by the conduction of the N-channel transistor T30. On the other hand, the electric potential of the AND gate G61 employed in the memory block MB3 shown in FIG. 9 is set at the "H" level, selecting the word line W1 as a selected word line.

As a result, the memory-cell transistor C11 is selected.

First of all, the chip-select signal CS is reset to the "L" level and the address input signals A0 to A3 are received. At the same time, the level of the clock signal P1 changes from "L" to "H". When the chip-select signal CS of the memory device shown in FIG. 8 is reset to the "L" level, the P-channel transistor T25 is turned on, causing the electric potentials of the node N3 and a node N4 to rise to a predetermined value. The selector SL selects the bit line B0 as described above, coupling the bit line B0 to the node S. Since the level of the clock signal P2 in the memory block MB3 is "L", no operation affecting bit lines is carried out.

In this state, the level "H" of the clock signal P1 turns on the P-channel transistor T22, charging up the node N1 toward the 5 V electric potential VDD of the power supply. At the same time, the electric potentials of the node S and the bit line B0 are also charged up to about 1.5 V through the N-channel transistor T1. As a result, the output of the inverter I1, that is, the electric potential of the node N2, is reset to the "L" level. Then, after the bit line B0 has gotten in an all but steady state, the level of the clock signal P1 becomes "L". The period up to this point of time is referred to a precharge period.

As the level of the clock signal P1 turns to "L", causing the P-channel transistor T22 to no longer supply a current, the electric potentials of the nodes N1 and S as well as the bit line B0 slightly decrease. However, the electric potentials decrease only by an amount small enough not to have an effect on the output of the inverter I1. Later on, the drain current of the P-channel transistor T21 causes the electric potentials of the nodes N1 and S as well as the bit line B0 to rise little by little.

Next, the level of the clock signal P2 turns to "H". As a result, the level of the electric potential of the word line W1 changes from "L" to "H". Since the threshold voltage of the gate of the N-channel transistor serving as the memory-cell transistor C11 is higher than 5 V, however, the memory-cell transistor C11 is not turned on, having all but no effect on the bit line B0. Thus, the electric potentials of the node S connected to the bit line B0 and the node N1 do not change and the electric potential of the node N2 remains at the "L" level as it is. As a result, "L" information is read out from the memory device.

The explanation continues to a next example of a case in which the levels of the address input signals A3, A2, A1 and A0 are all reset at "L". In this case, the output of the NAND gate G30 employed in the selector SL is reset at the "L" level which is inverted by the inverter 132 to an "H" level. As a result, the gate input of the N-channel transistor T30 is set at the "H" level, turning on the N-channel transistor T30. In this state, the bit line B0 is the selected bit line coupled to the node S by the conduction of the N-channel transistor T30. On the other hand, the electric potential of only the AND gate G60 employed in the memory block MB3 is set at the "H" level, selecting the word line W0 as a selected word line. As a result, the memory-cell transistor C3 is selected. Also in this case, operations till the level of the clock signal P2 turns to "H" are the same as the first example described above. As the level of the clock signal P2 turns to "H", the output of the AND gate G60 and the electric potential of the word line W0 turn to the "H" level. As a result, the gate of the N-channel transistor serving as the memory-cell transistor C3 is raised, turning on the memory-cell transistor C3 which draws a memory-cell current from the bit line B0.

Since the magnitude of this current is five times that of the drain current of the P-channel transistor T21, the electric potential of the node N1 gradually decreases. The electric potentials of the node S and the bit line B0 also decrease but, since the capacitance of the bit line B0 is much larger than that of the node N1, the drop in electric potential on the bit line B0 is small. When the electric potential of the node N1 becomes equal to or lower than a predetermined value, the level of the output of the inverter I1 changes from "L" to "H". In this state, since the N-channel transistor T3 is turned on at a point of time the level of the clock signal P1 turns to "L", the N-channel transistor T2 is turned on, thus drawing a current much larger than the memory-cell current from the node N1. As a result, the drop of the electric potential of the node N1 is accelerated and the rise of the electric potential of the node N2 from "L" to "H" is also accelerated. Thus, "H" information is read out from the memory device.

The following is description of an example of a case in which the levels of the address input signals A3, A2, A1 and A0 are set at "L", "L", "H" and "H", respectively. In this case, using the same reasoning as those of the two examples described above, the selected bit line and the selected word line are found to be B3 and W0 respectively, selecting the memory-cell transistor C10. The operations in this case are all but the same as the case described above in which the memory-cell transistor C3 is selected except that the selected bit line is now B3. In this case, however, due to the resistances of wire resistors R4, R8 and R12 in conjunction with the gate capacitances of the memory-cell transistors C5, C15 and C10, the timing with which the electric potential of the gate of the memory-cell transistor C10 rises much lags behind the word line W0. As a result, the timing with which the electric potentials of the bit line B3 and the nodes S and N1 decrease lags as well and, in its turn, the change of the electric potential of the node N2 also lags as shown in the drawing. As a result, "H" information is read out from the memory device but the time it takes to read the information, that is, the access time, is longer than that of the previous example.

SUMMARY OF THE INVENTION

In a memory device employing a conventional memory sense amplifier of the grounded-gate type, there is encountered a problem that, since the electric potential of a word line is set at the "H" level after a precharge operation is completed as described above, at the end of the word line, the change of the gate potential of the memory cell lags due to the wire resistance of the word line and the gate capacitance of the memory cell, inadvertently increasing the access time.

The present invention addresses the problem described above; it is thus an object of the present invention to provide a memory device which is not affected by the wire resistances of word lines and, hence, has a short access time.

According to a first aspect of the present invention, there is provided a memory device comprising:

a first source of current coupled to a first source of voltage for supplying a first electric potential;

a first field-effect transistor with a drain thereof coupled to the first source of current;

a second source of current connected to the drain for supplying a current during a first period;

memory-cell field-effect transistors each connected to a second source of voltage for supplying a second electric potential lower than the first electric potential;

a plurality of bit lines each connected to some of the memory-cell field-effect transistors; and a select means connected to the bit lines for selecting one of the bit lines and for coupling the selected bit line to a source of the first field-effect transistor; and a logic judging means for forming a judgment on a logic value by comparison of the electric potential of the drain with a predetermined value set between the first and second electric potentials during a second period in which the second source of current does not supply a current to the drain, wherein some of the memory-cell field-effect transistors connected to one of the bit lines selected by the select means each draw a current from the selected bit line over the first and second periods.

In the configuration according to the first aspect of the present invention described above, the memory-cell field-effect transistors are each turned on not only during the second period in which the drain thereof is not supplied with a current from the first field-effect transistor but also during the first period. Thus, an effect of a lagging change in gate electric potential of the memory cell caused by wire resistances of word lines connected between the field-effect transistors employed in the memory cell on the access time can be reduced. As a result, the present invention exhibits an effect of implementation of a memory device which is capable of operating at a high speed with a short access time.

According to a second aspect of the present invention, there is provided a memory device according to the first aspect of the present invention further including a third source of current and a third source of voltage comprising:

a second field-effect transistor having a gate length equal to that of the first field-effect transistor, a gate width substantially equal to r times that of the first field-effect transistor where r is a positive real number and a drain as well as a gate thereof connected to the third source of current; and a third field-effect transistor having a gate length equal to that of each the memory-cell field-effect transistors, a gate width substantially equal to r times that of each of the memory-cell field-effect transistors, a drain thereof coupled to a source of the second field-effect transistor and a source thereof connected to the second electric potential, wherein the gate of the second field-effect transistor is connected to a gate of the first field-effect transistor.

In the configuration according to the second aspect of the present invention described above, a current-mirror effect reduces a memory-cell current to 1/r of a current supplied by the third source of current. As a result, the present invention exhibits an effect of implementation of a memory device which is capable of operating with reduced power consumption.

According to a third aspect of the present invention, there is provided a memory device according to the second aspect of the present invention further comprising a first switching means connected between the first source of voltage and the first as well as third sources of current for switching a current supplied to the first as well as third sources of current.

In the configuration according to the third aspect of the present invention described above, the first and third sources of current are connected to the first source of voltage through the first switching means. As a result, the present invention exhibits an effect of implementation of a memory device which is capable of supplying a current by synchronizing a third source of voltage comprising the second and third field-effect transistors to the first field-effect transistor and the memory-cell transistors by virtue of switching operations of the first switching means.

According to a fourth aspect of the present invention, there is provided a memory device according to the first aspect of the present invention wherein a plurality of the memory-cell field-effect transistors are employed to constitute a NOR-type or NAND-type memory block.

In the configuration according to the fourth aspect of the present invention described above, the change in electric potential occurring in the gate of a memory-cell transistor can be set to finish at a point of time at the end of a precharge period. As a result, the present invention exhibits an effect of implementation of a memory device which is capable of reducing an effect of a lagging change in electric potential of the gate of a memory-cell transistor on the access time even if such a lagging change occurs due to wire resistances of word lines. In addition, in the case of a memory block of the NAND type wherein transistors forming a selected bit line can be connected to each other in series, the present invention also exhibits an effect of implementation of a memory device which is capable of operating with reduced power consumption due to a decreased magnitude of current flowing thereto.

According to a fifth aspect of the present invention, there is provided a memory device according to the first aspect of the present invention further comprising a second switching means inserted between the first source of current and the first field-effect transistor and also connected to an output of the logic judging means wherein the second switching means carries out switching operations in accordance with a signal output by the logic judging means.

In the configuration according to the fifth aspect of the present invention described above, the current can be cut off at a point of time the level of a signal output by the logic judging means becomes sufficient. As a result, the present invention exhibits an effect of implementation of a memory device which is capable of avoiding excessive power consumption.

According to a sixth aspect of the present invention, there is provided a memory device according to the first aspect of the present invention wherein a gate of the first field-effect transistor is held at the first electric potential.

If the scheme according to the sixth aspect of the present invention is adopted in conjunction with a memory block of the NAND type, the number of transistors used in the memory device can be reduced. As a result, the present invention exhibits an effect of implementation of a memory device which is capable of operating with reduced power consumption.

BRIEF DESCRIPTION OF THE DRAWINGS

Embodiments of the present invention will be described with reference to the following figures wherein.

DETAILED DESCRIPTION OF THE PREFERRED EMBODIMENTS

The present invention will become more apparent from a study of the following detailed description of preferred embodiments with reference to the accompanying diagrams some of which show the embodiments.

First Embodiment

Figure 1:
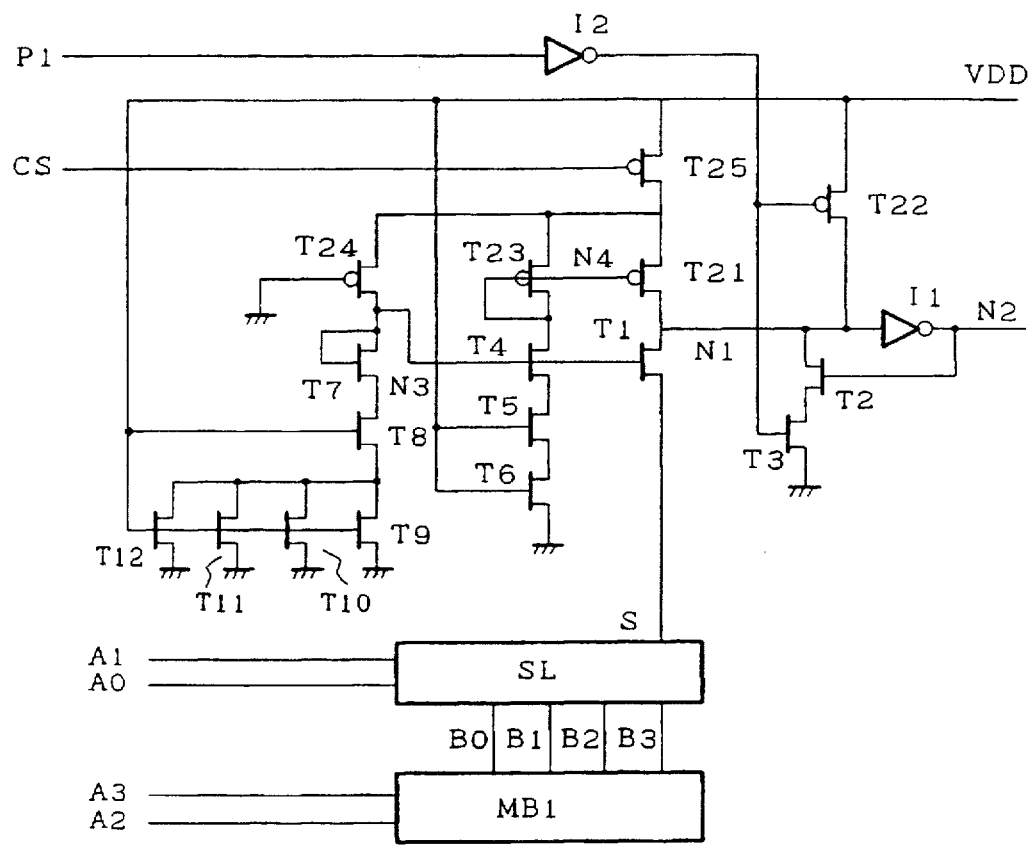
FIG. 1 is a diagram showing the configuration of a memory device implemented by a first embodiment of the present invention.

FIG. 1 is a diagram showing the configuration of a memory device of a grounded-gate type implemented by a first embodiment of the present invention. In the drawing, numerals T1 to T12 each denote an N-channel transistor, numerals T21 to T25 each denote a P-channel transistor, numerals I1 and I2 are each an inverter, numeral SL denotes a selector (or a selecting means) and numeral MB1 is a memory block.

It should be noted that the N-channel transistor T1 is a first field-effect transistor and the N-channel transistor T7 is a second field-effect transistor serving as a third source of voltage. The N-channel transistors T8 to T12 are third field-effect transistors constituting a third source of voltage. On the other hand, the P-channel transistors T21, T22 and T24 are first, second and third source of currents respectively whereas the P-channel transistor T25 is a first switching means.

Figure 2:
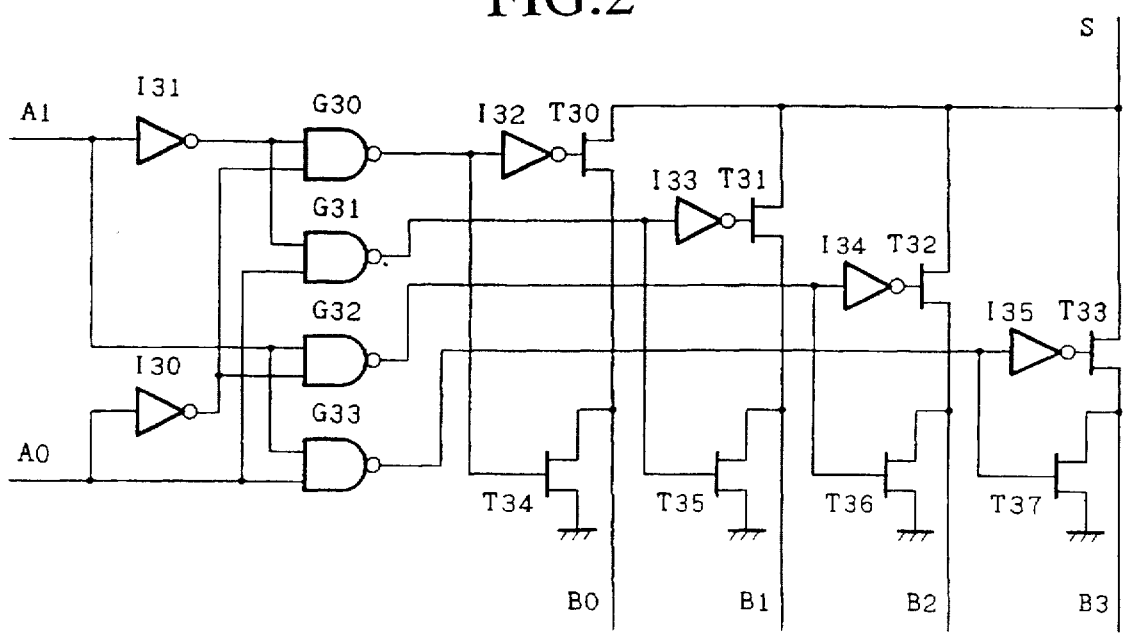
FIG. 2 is a circuit diagram showing a selector employed in the first embodiment, second and third embodiments of the present invention as well as the conventional memory device.

FIG. 2 is a circuit diagram showing a selector SL employed in the memory device implemented by the first embodiment shown in FIG. 1. In FIG. 2, numerals G30 to G33 each denote a NAND gate, numerals I30 to I35 are each an inverter, numerals T30 to T33 are a group of N-channel transistors having the same channel length and the same channel width and numerals T34 to T37 are another group of N-channel transistors having the same channel length and the same channel width.

Figure 3:
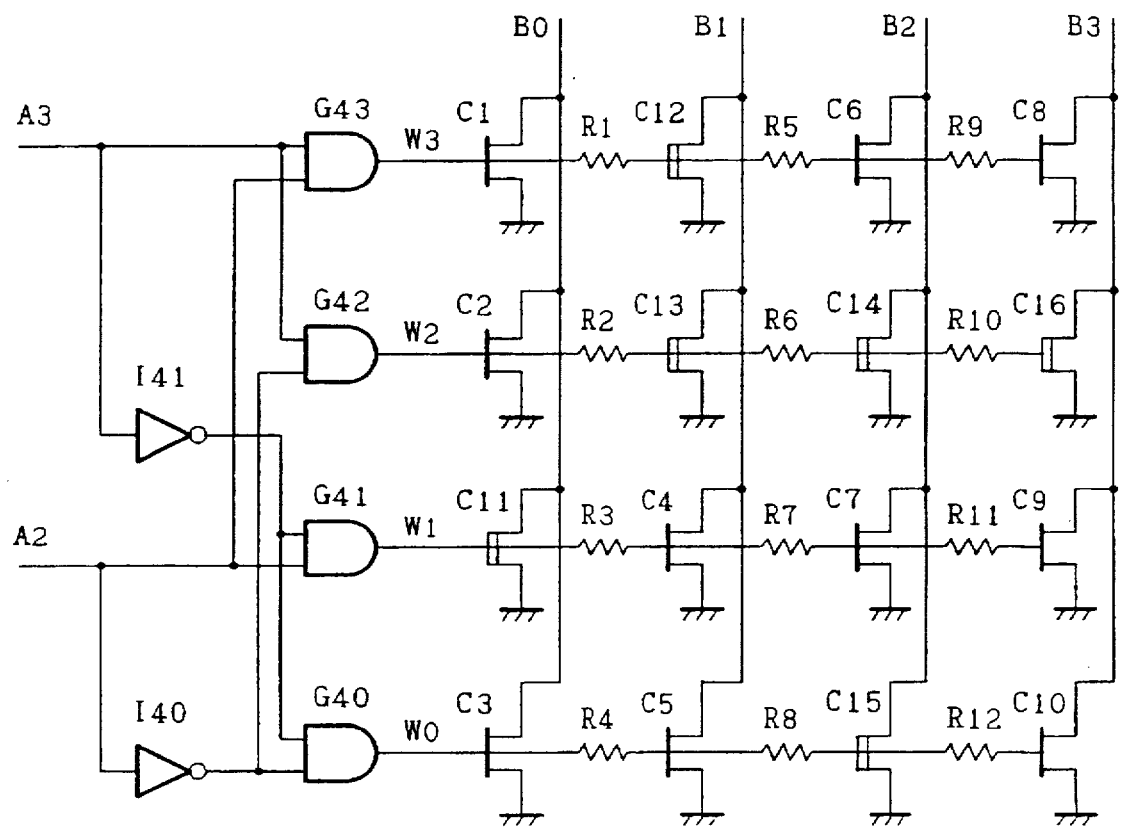
FIG. 3 is a circuit diagram showing a memory block of memory devices implemented by the first and third embodiments of the present invention.

FIG. 3 is a circuit diagram showing a memory block MB1 of memory devices implemented by the first embodiment of the present invention. The memory block comprises components described as follows. In the drawing, numerals G40 to G43 each denote an AND gate, numerals I40 to I41 are each an inverter, numerals C1 to C10 are memory-cell transistors (memory-cell field-effect transistors) having the same channel length and the same channel width, numerals C11 to C16 are other memory-cell transistors (memory-cell field-effect transistors) having the same channel length and the same channel width and numerals R1 to R12 are wire resistances of word lines W0 to W3. The transistors C1 to C16 are each an N-channel transistor forming a memory cell. It should be noted that the memory-cell transistors C11 to C16 each have a threshold voltage higher than 5 V, a value higher than the other memory-cell transistors, so that, even with the gate voltage thereof varied in the range 0 to 5 V, the drain current is merely smaller than 1 nA and can be set to be almost virtually not flowing.

The function of the memory device implemented by the first embodiment is explained as follows.

The electric potential VDD of the power supply of the memory device implemented by the first embodiment is about 5 V. The memory device is operative when a chip-select signal CS of the memory device shown in FIG. 1 is reset to the "L" level. If the chip-select signal CS is set to the "H" level, on the other hand, the memory device is put in a deselected state and thus not operative. When the chip-select signal CS is reset at the "L" level, the P-channel transistor T25 is turned on, pulling up the electric potentials of the sources of the P-channel transistors T24, T23 and T21 connected to the P-channel transistor T25 up to 5 V.

The P-channel transistor T24 and the N-channel transistors T7 to T12 work as a source of voltage supplying an electric potential to the gate of the N-channel transistor T1. A current of about 400 μA flows from the drain of the P-channel transistor T24 to the N-channel transistors T7 to T12. The N-channel transistors T9 to T12 have the same channel length and the same channel width as the memory-cell transistor C1. By the same token, the N-channel transistor T7 has the same channel length and four times channel width as the N-channel transistor T1. Likewise, the N-channel transistor T8 has the same channel length as N-channel transistor T30 but the channel width of the former is four times that of the latter. As a result, affected by the current-mirror effect, the electric potential of a node N3 is settled at a value that causes a memory-cell current of about 100 μA, about ¼ of the 400 μA cited above, to flow through the memory-cell transistors C1 to C10. This value is found out to be about 1.4 V.

Since the N-channel transistor T1 is a grounded-gate amplifier, the electric potential at a node N1 is changed in accordance with the magnitude of a current drawn from a node S. The inverter I1 outputs an "L" or "H" level to a node N2 depending upon whether or not the electric potential at the node N1 is higher than a predetermined value. During a precharge period (a period in which the signal level of a clock P1 signal is set at "H"), the inverter I2 and the P-channel transistor T22 precharge one of bit lines B0 to B3 connected to the node S through the nodes N1 and S and the selector SL. The N-channel transistors T2 and T3 work as a positive feedback circuit which draws a current from the node N1, accelerating the change in electric potential when the level of the electric potential at the node N2 changes from "L" to "H".

The inverters I30 and I31 and the NAND gates G30 to G33 employed in the selector SL shown in FIG. 2 constitute an ordinary two-to-four decoder. Depending upon the combination of the "H" or "L" levels of two address input signals A1 and A0, the output of one of the four NAND gates G30 to G33 is reset to the "L" level while the remaining three outputs are all set at the "H" level. The inverters I32 to I35 and the N-channel transistors T30 to T33 couple one of the bit lines B0 to B3 which is associated with the NAND gate reset at the "L" level to the node S. The bit line B0, B1, B2 or B3 coupled to the node S is referred to hereafter as a selected bit line. At that time, the N-channel transistors T34 to T37 reset the electric potentials of the bit lines other than the selected bit line at the ground level, that is, at 0 V.

Assume, for example, that the levels of the address input signals A1 and A0 are set at "H" and reset at "L" respectively. In this case, the output of the NAND gate G32 employed in the selector SL is reset at the "L" level which is inverted by the inverter I34 to an "H" level. As a result, the gate input of the N-channel transistor T32 is set at the "H" level, turning on the N-channel transistor T32. In this state, the bit line B2 is coupled to the node S by the conduction of the N-channel transistor T32. On the other hand, the electric potentials of the bit lines B0, B1 and B3 are pulled down to 0 V. This is because the electric potentials of the gates of the N-channel transistors T34, T35 and T37 are all set at the "H" level, turning on all the N-channel transistors T34, T35 and T37 which, in turn, couple the bit lines B0, B1 and B3 respectively to the electric potential GND of the ground.

By the same token, the inverters I40 and I41 and the AND gates G40 to G43 employed in the memory block MB1 shown in FIG. 3 constitute an ordinary two-to-four decoder with the outputs of the AND gates G40 to G43 connected to the word lines W0 to W3 respectively. Since the gates G40 to G43 are AND gates, however, one of the word lines W0 to W3 specified by the address input signals A3 and A2 is set to the "H" level while the other word lines are reset at the "L" level. The word line W0, W1, W2 or W3 specified by the address input signals A3 and A2 is referred to hereafter as a selected word line. It should be noted, however, that since the AND gates G40 to G43 employed in the memory block MB1 do not input a clock signal P2 as a strobe signal, when the input address signals A3 and A2 change, the word lines W0 to W3 also instantaneously change in accordance with the changes in A3 and A2. In addition, when the word line connected to the gate of any of the memory-cell transistors C1 to C10 is set to the "H" level, the memory-cell transistor whose gate is connected to the word line is turned on, thus drawing a memory-cell current from the bit line connected to the drain thereof. On the other hand, the threshold voltage of the memory-cell transistors C11 to C16 is higher than 5 V. As a result, there is no effect on bit lines even if the electric potentials of the word lines connected to the gates of the transistors C11 to C16 are changed.

Figure 4:
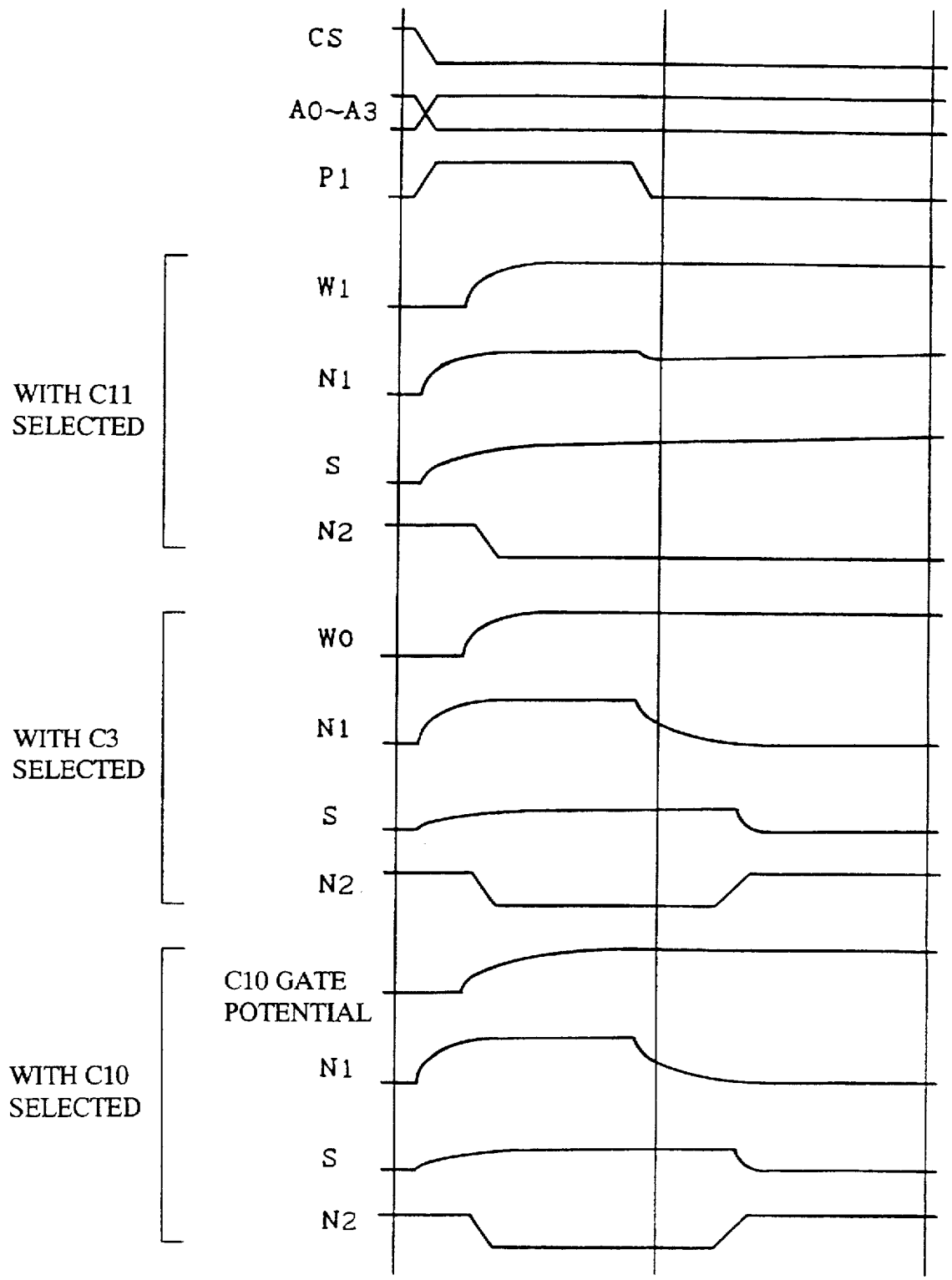
FIG. 4 is timing charts of a memory device implemented by the first embodiment of the present invention.

Next, the operation of the memory device implemented by the first embodiment is explained by referring to timing charts shown in FIG. 4.

The explanation begins with a first example of a case in which the levels of the address input signals A3, A2, A1 and A0 are set at "L", "H", "L" and "L", respectively. In this case, the output of the NAND gate G30 employed in the selector SL is reset at the "L" level which is inverted by the inverter I32 to an "H" level. As a result, the gate input of the N-channel transistor T30 is set at the "H" level, thus turning on the N-channel transistor T30. In this state, the bit line B0 is the selected bit line coupled to the node S by the conduction of the N-channel transistor T30. On the other hand, the electric potential of the AND gate G41 employed in the memory block MB1 is set at the "H" level, thus selecting the word line W1 as a selected word line. As a result, the memory-cell transistor C11 is selected.

First of all, the chip-select signal CS is reset to the "L" level and the address input signals A0 to A3 are received. At the same time, the level of the clock signal P1 changes from "L" to "H". When the chip-select signal CS is reset to the "L" level, the P-channel transistor T25 is turned on, causing the electric potentials of the node N3 and a node N4 to rise to a predetermined value. The selector SL selects the bit line B0 as described above, connecting the bit line B0 to the node S. In the memory block MB1, on the other hand, the word line W1 is set at the "H" level, raising the electric potential of the gate of the memory-cell transistor C11 to the "H" level as well. Since the threshold voltage is higher than 5 V, however, the operation has all but no effect on the bit line B0.

In this state, the level "H" of the clock signal P1 turns on the P-channel transistor T22, charging up the node N1 toward the 5 V electric potential VDD of the power supply. At the same time, the electric potentials of the node S and the bit line B0 are also charged up through the N-channel transistor T1. It should be noted that, in the case of the present memory device, since the electric potential of the node N3 is about 1.4 V, the electric potentials of the node S and the bit line B0 are charged up to only about 0.4 V. As a result of charging up the node N1, the output of the inverter I1, that is, the electric potential of the node N2, is reset to the "L" level. Then, after the bit line B0 has gotten in an all but steady state, the level of the clock signal P1 becomes "L". The period up to this point of time is referred to a precharge period.

As the level of the clock signal P1 turns to "L", causing the P-channel transistor T22 to no longer supply a current, the electric potentials of the nodes N1 and S as well as the bit line B0 slightly decrease. However, the electric potentials decrease only by an amount small enough not to have an effect on the output of the inverter I1. Later on, since the drain current of the P-channel transistor T21 causes the electric potentials of the nodes N1 and S as well as the bit line B0 to rise little by little, the electric potential of the node N2 remains at the "L" level as it is. As a result, "L" information is read out from the memory device.

The explanation continues to a next example of a case in which the levels of the address input signals A3, A2, A1 and A0 are all reset at "L". In this case, the output of the NAND gate G30 employed in the selector SL is reset at the "L" level which is inverted by the inverter I32 to an "H" level. As a result, the gate input of the N-channel transistor T30 is set at the "H" level, turning on the N-channel transistor T30. In this state, the bit line B0 is the selected bit line coupled to the node S by the conduction of the N-channel transistor T30. On the other hand, the electric potential of the AND gate G40 employed in the memory block MB1 is set at the "H" level, selecting the word line W0 as a selected word line. As a result, the memory-cell transistor C3 is selected. Also in this case, operations till the bit line B0 is coupled to the S node are the same as the first example described above.

As the level of the word line W0 turns to "H", the memory-cell transistor C3 draws a memory-cell current from the bit line B0. As the level of the clock signal P1 turns to the "H" level, the P-channel transistor T22 is turned on. At that time, since the drain current of the P-channel transistor T22 is much larger in magnitude than the memory-cell current, the electric potential of the node N1 is charged up toward 5 V. In addition, the node S and the bit line B0 are also charged up as well. However, since a memory-cell current flows to the N-channel transistor T1, the potential thereof is lower by about 0.2 V than that or the preceding example described previously.

After a while, the level of the clock signal P1 turns to "L", turning off the P-channel transistor T22. Since the magnitude of the memory-cell current of the memory-cell transistor C3 is five times that of the drain current of the P-channel transistor T21, in this state, the electric potential of the node N1 gradually decreases. The electric potentials of the node S and the bit line B0 also decrease but, since the capacitance of the bit line B0 is much larger than that of the node N1, the drop in electric potential on the bit line B0 is small. When the electric potential of the node N1 becomes equal to or lower than a predetermined value, the level of the output of the inverter I1 changes from "L" to "H". In this state, since the N-channel transistor T3 is turned on at a point of time the level of the clock signal P1 turns to "L", the N-channel transistor T2 is turned on, drawing a current much larger than the memory-cell current from the node N1. As a result, the drop of the electric potential of the node N1 is accelerated and the rise of the electric potential of the node N2 from "L" to "H" is also accelerated as well. Thus, "H" information is read out from the memory device.

The following is description of an example of a case in which the levels of the address input signals A3, A2, A1 and A0 are set at "L", "L", "H" and "H", respectively. In this case, for the same reasoning as those of the two examples described above, the selected bit line and the selected word line are B3 and W0 respectively, selecting the memory-cell transistor C10. The operations in this case are all but the same as the case described above in which the memory-cell transistor C3 is selected except that the selected bit line is now B3. In this case, however, due to the resistances of wire resistors R4, R8 and R12 in conjunction with the gate capacitances of the memory-cell transistors C5, C15 and C10, the timing with which the electric potential of the gate of the memory-cell transistor C10 rises much lags behind the word line W0. In the case of the memory device implemented by the first embodiment, however, during a period in which the level of the clock signal P1 is set at "H", the electric potential of the word line W0 is also set at the "H" level, causing the electric potential of the gate of the memory-cell transistor C10 to reach the "H" level before the level of the clock signal P1 turns to "L". As a result, the timing with which the electric potential of the node N1 decreases is almost the same as the example described previously, resulting in nearly equal access time. As a result, "H" information is read out from the memory device without giving rise to an increase in access time.

As described above, the first embodiment shortens the delay of the change of the gate potential of the memory-cell transistor due to the wire resistance of the word line and, hence, reduces the effect on the access time, exhibiting an effect of allowing a memory device with a short access time to be implemented. In addition, the first embodiment also exhibits an effect of lowering the electric potential of the bit line during a precharge period and reducing the magnitude of the memory-cell current, hence, allowing a memory device with low power consumption to be implemented.

Second Embodiment

Figure 5:
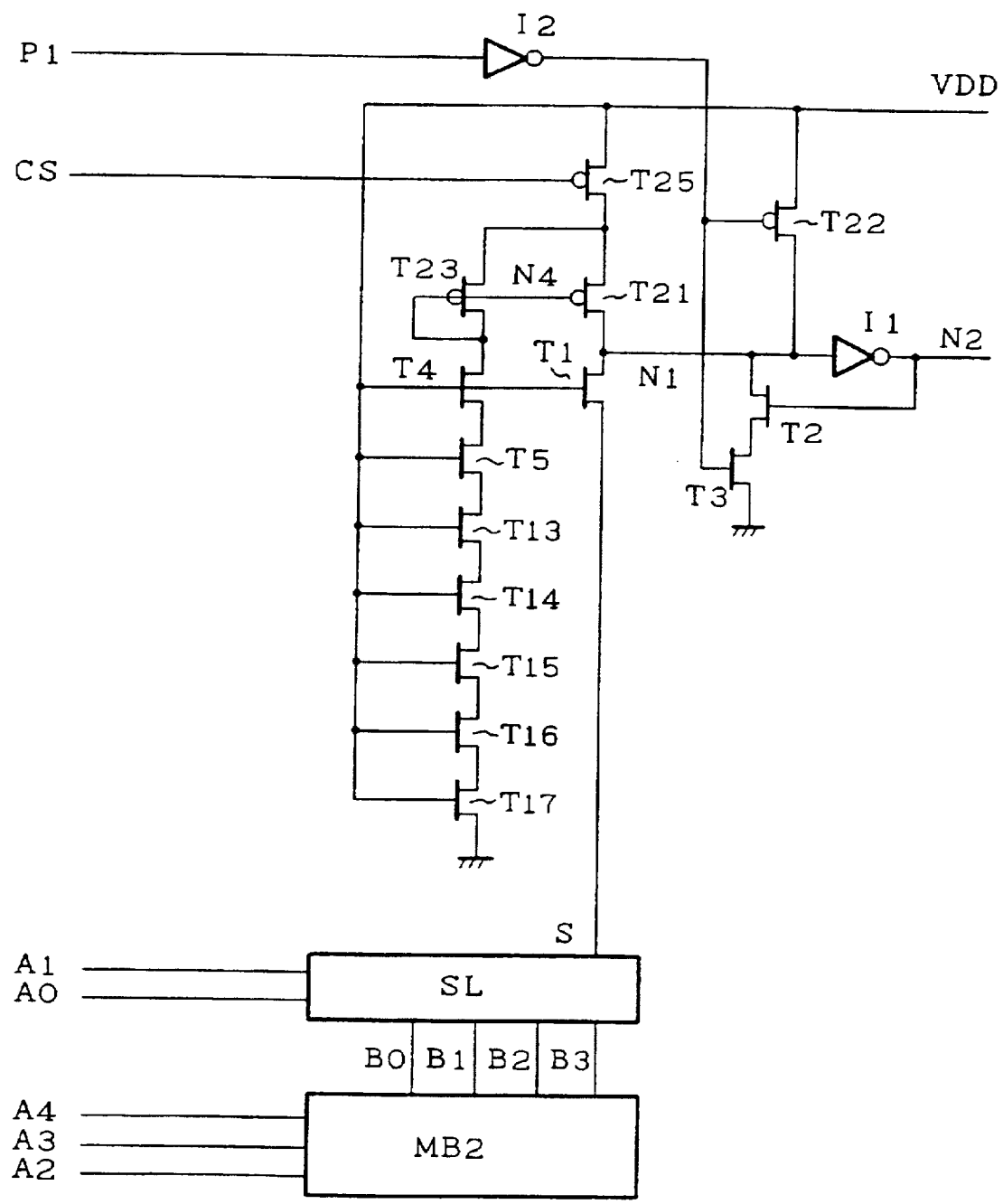
FIG. 5 is a diagram showing the configuration of a memory device implemented by a second embodiment of the present invention.

FIG. 5 is a diagram showing the configuration of a memory device employing a memory sense amplifier of the grounded-gate type implemented by a second embodiment of the present invention. The second embodiment is different from the first embodiment in that, in the case of the former, the N-channel transistors T7 to T12 and the P-channel transistor T24 are eliminated; the gate of the N-channel transistor T1 is connected to the electric potential VDD of the power supply; the N-channel transistor T6 replaces the five N-channel transistors T13 to T17 which are connected to each other in series; and a memory block MB2 is a NAND-type memory block.

Since the rest is the same as the configuration shown in FIG. 1, components identical with those shown in FIG. 1 are denoted by the same numerals as those used in FIG. 1 and no explanation is duplicated.

Figure 6:
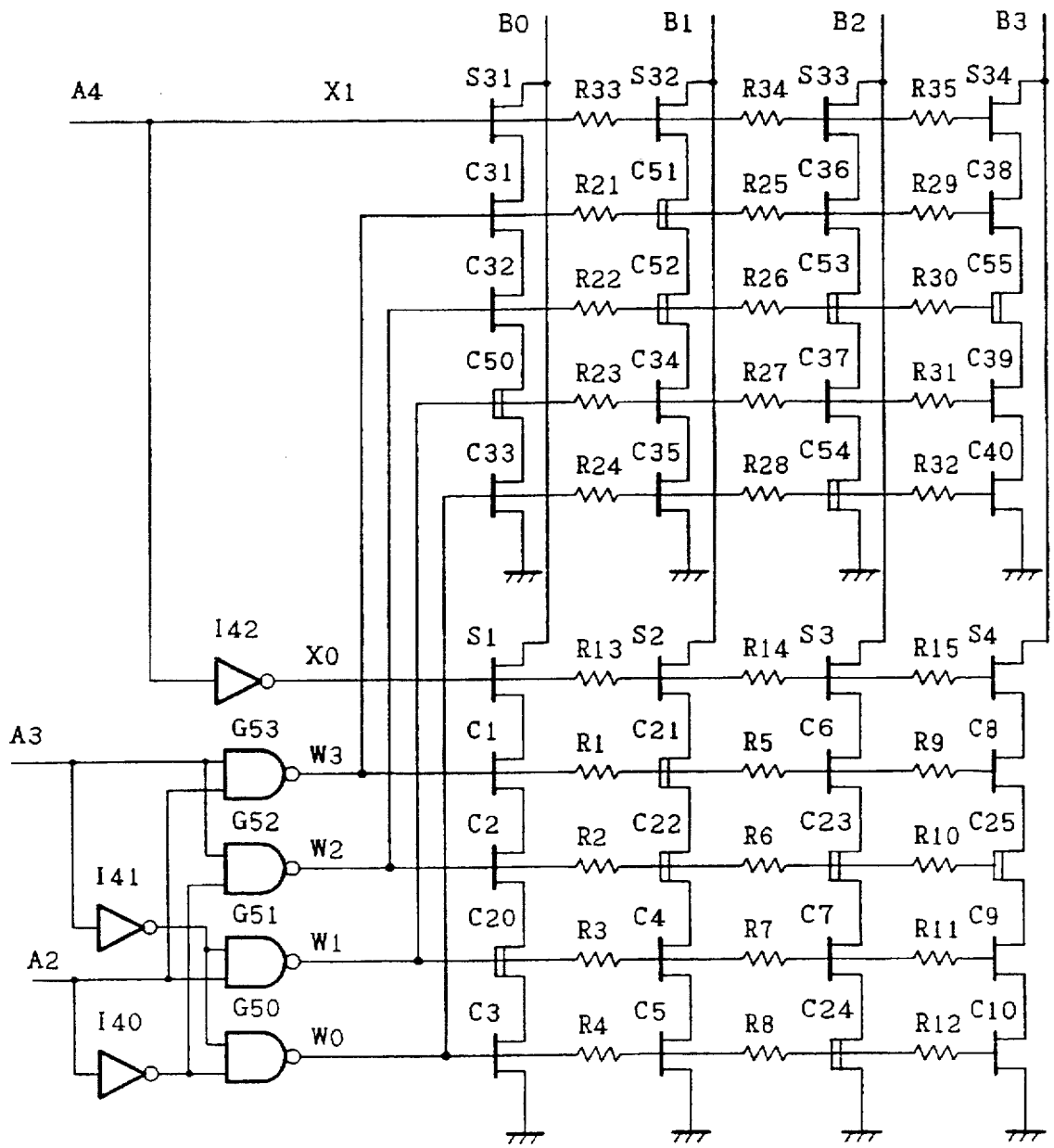
FIG. 6 is a circuit diagram showing a memory block of the memory device implemented by the second embodiment of the present invention.

FIG. 6 is a circuit diagram showing a memory block MB2 of the memory device implemented by the second embodiment of the present invention. The memory block comprises components described as follows. In the drawing, numerals G50 to G53 each denote a NAND gate, numerals I40 to I42 are each an inverter, and numerals C1 to C10, C20 to C25, C31 to C40 and C50 to C55 are N-channel memory-cell transistors (memory-cell field-effect transistors). The N-channel memory-cell transistors C1 to C10 and C31 to C40 are the same as the memory-cell transistors C1 to C10 employed in the memory block MB1 described earlier. On the other hand, the N-channel memory-cell transistors C20 to C25 and C50 to C55 each have a threshold voltage equal to or lower than 0 V so that these transistors always remain in an on state even if the gate voltages thereof are varied over the range 0 to 5 V. Numerals S1 to S4 and S31 to S34 are each an N-channel transistor serving as a block select transistor whereas numerals R1 to R15 and R21 to R35 are wire resistors of the word lines W0 to W3 and select lines X0 and X1.

The function of the memory device implemented by the second embodiment is explained as follows.

The N-channel transistors T13 to T17 shown in FIG. 5 flow a current equal in magnitude to a memory-cell current to the P-channel transistor T23. Let us think a case in which the bit line B0 is selected by the selector SL for example. The N-channel transistor T13 has the same channel length and the same channel width as the block select transistor S1. By the same token, the N-channel transistors T14 to T17 have the same channel length and the same channel width as the memory-cell transistors C1 to C3. As a result, affected by the current-mirror effect, a current equal in magnitude to a current drawn by the block select transistor S1 and the memory-cell transistors C1 to C3 from the bit line B0, that is, equal in magnitude to the memory-cell current, flows to the P-channel transistor T23 and a current equal in magnitude to about ⅕ of the memory-cell current flows to the P-channel transistor T21.

The inverter I42 and the block select transistors S1 to S4 and S31 to S34 employed in the memory block MB2 shown in FIG. 6 function as a selector for selecting either a cell block A composed of the memory-cell transistors C1 to C10 and C20 to C25 or a cell block B composed of the memory-cell transistors C31 to C40 and C50 to C55 in dependence on the value of an address input signal A4, and coupling the selected cell block to the bit lines B0 to B3.

The inverters I40 and I41 and the NAND gates G50 to G53 employed in the memory block MB2 shown in FIG. 6 constitute an ordinary two-to-four decoder. Depending upon the combination of the "H" or "L" levels of two address input signals A3 and A2, one of the four word lines W0 to W3 driven by the four gates G50 to G53 respectively is reset to the "L" level while the remaining three outputs are all set at the "H" level because the gates G50 to G53 are each a NAND gate. Thus, memory cells in the cell blocks A and B connected to word lines other than the selected word line are all turned on. A memory cell connected to the selected word line is turned off in the case of the memory-cell transistors C1 to C10 and C31 to C40 and turned on in the case of the memory-cell transistors C20 to C25 and C50 to C55. As a result, in the case of the memory-cell transistors C20 to C25 and C50 to C55, the memory cell connected to the selected word line draws a current from a bit line connected thereto. In the case of the memory-cell transistors C1 to C10 and C31 to C40, on the other hand, the memory cell connected to the selected word line draws no current.

Next, the operation of the memory device implemented by the second embodiment is explained as follows.

A process to read out "H" or "L" information from the node N2 depending upon whether or not a current is drawn from the bit line is the same as the first embodiment, making it unnecessary to repeat the explanation thereof. In the case of the second embodiment, since the electric potential of the gate of the N-channel transistor T1 is set at a high level of about 5 V, the electric potential of the bit line also rises to about 4 V. In this case, however, since a total of five memory-cell transistors and block select transistors are connected to each of the bit lines B0 to B3 in series, a voltage between the source and the drain of the memory-cell transistor is equal to or lower than 1 V, causing the memory-cell current not to increase so much. In addition, in comparison with the first embodiment, since the N-channel transistors T7 to T12 and the P-channel transistor T24 are eliminated, the power consumption is reduced by an amount corresponding to the currents that would flow through these eliminated transistors.

As described above, according to the second embodiment, since the memory-cell transistors are each implemented by a transistor of the NAND type, a plurality of transistors can be connected in series to a bit line and the memory-cell current can be suppressed to a low level. In addition, since the number of transistors composing a current-mirror circuit can be reduced, the memory device exhibits an effect of reduced power consumption.

Third Embodiment

Figure 7:
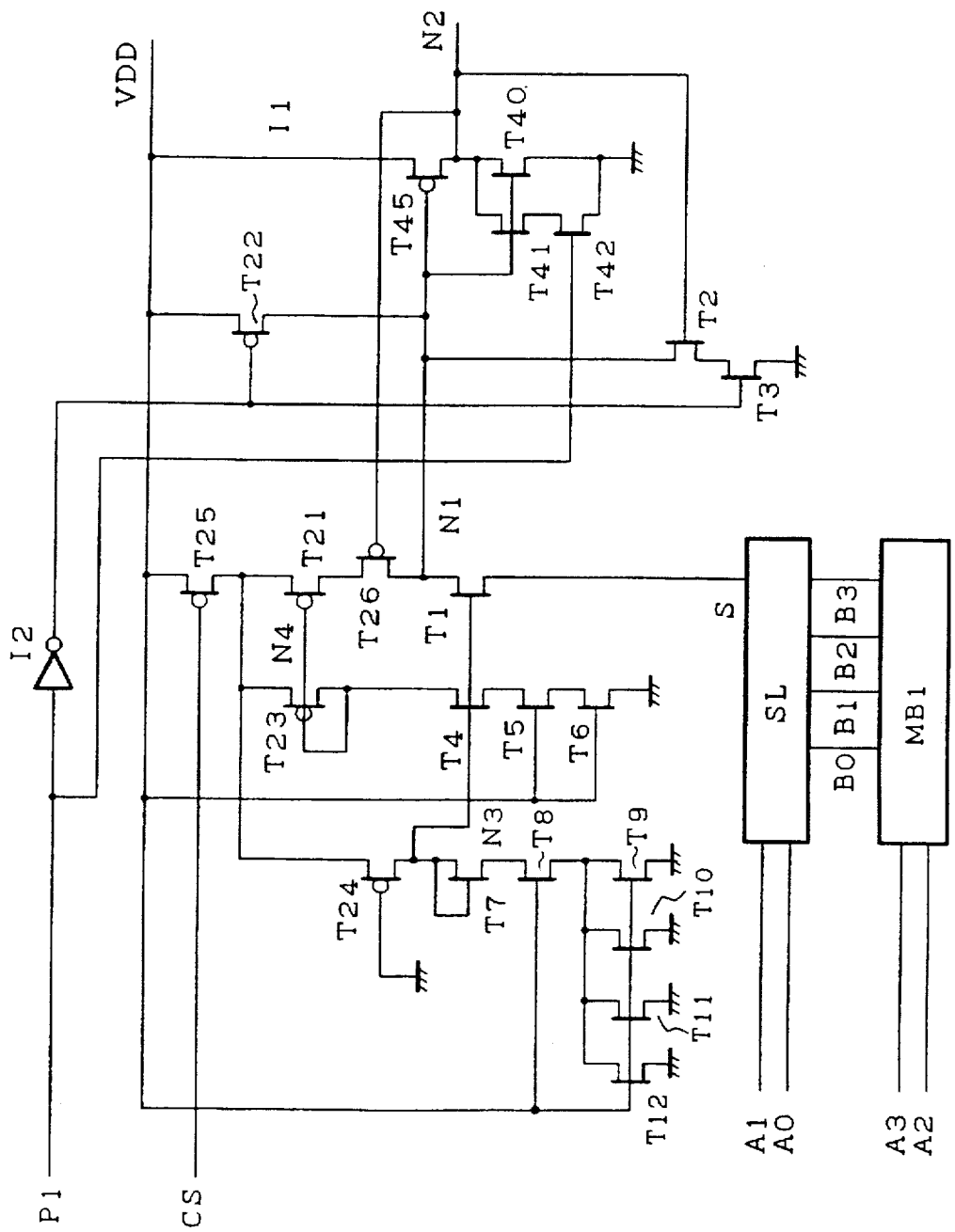
FIG. 7 is a diagram showing the configuration of a memory device implemented by the third embodiment of the present invention.
Figure 8:
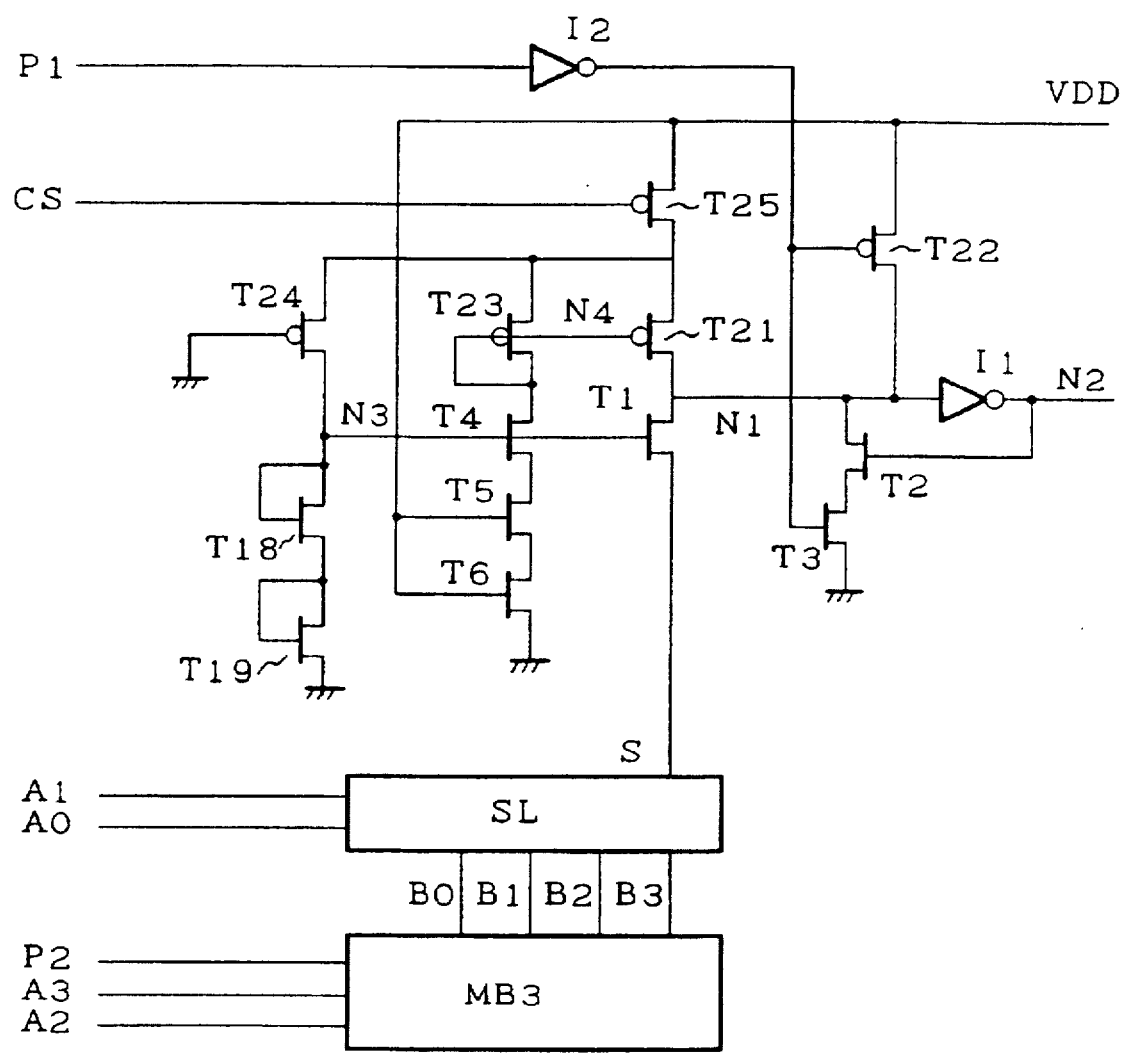
FIG. 8 is a diagram showing the configuration of a conventional memory device.
Figure 9:
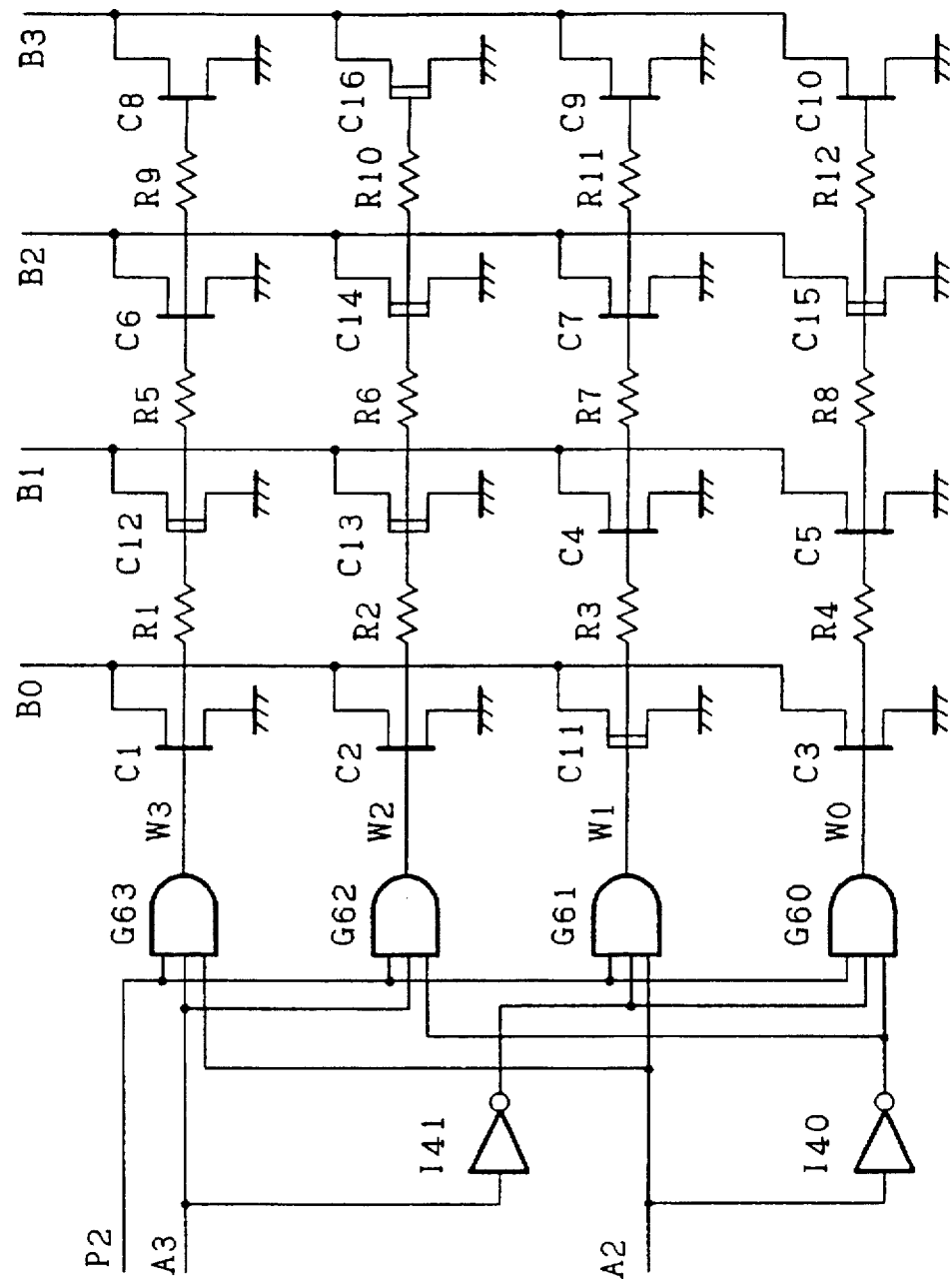
FIG. 9 is a circuit diagram showing a memory block of a conventional memory device.
Figure 10:
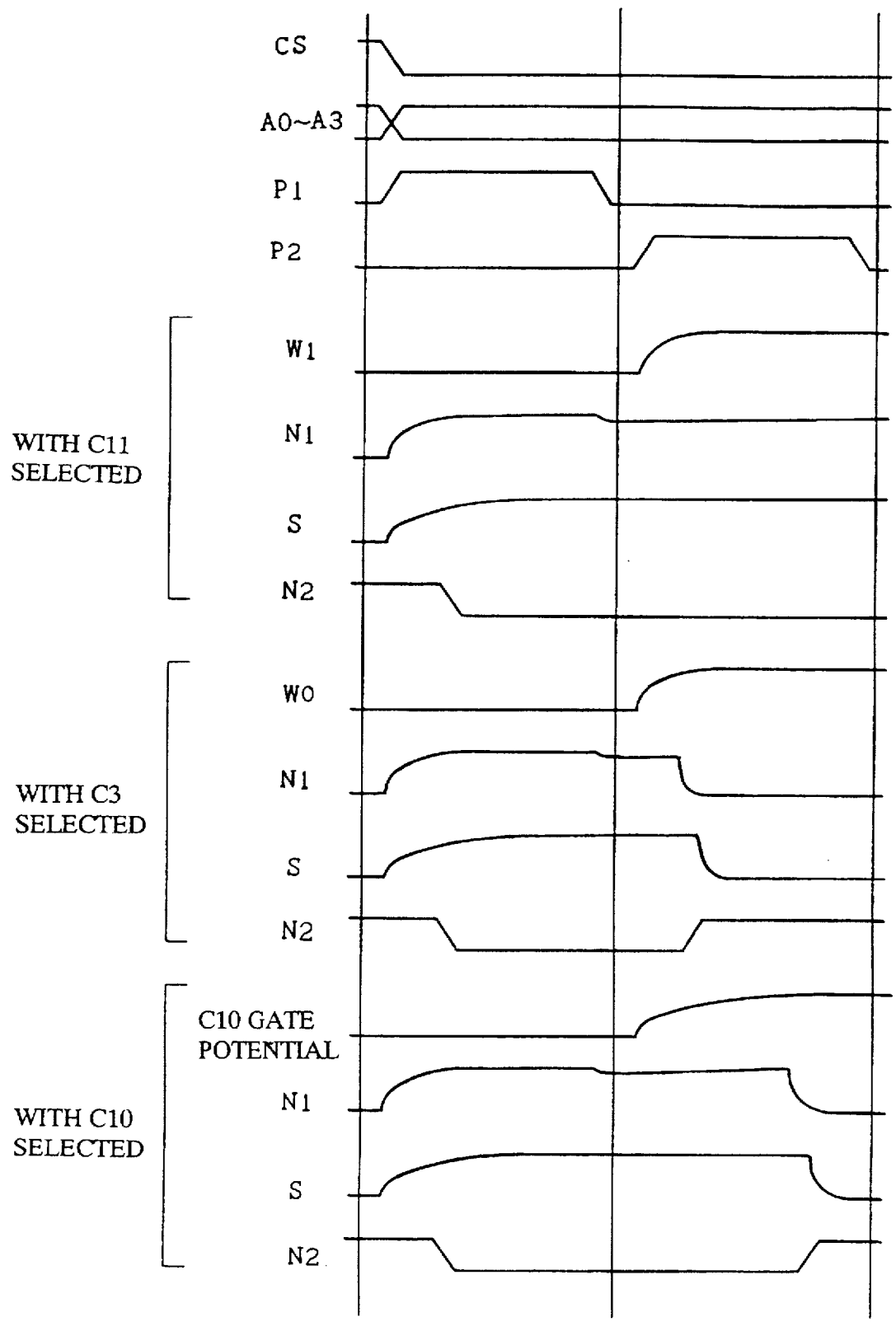
FIG. 10 is timing charts of a conventional memory device.

FIG. 7 is a diagram showing the configuration of a memory device employing a memory sense amplifier of a grounded-gate type implemented by the third embodiment of the present invention. The third embodiment is different from the first embodiment in that, in the case of the former, a P-channel transistor T26 whose gate is connected to the node N2 is inserted between the P-channel transistor T21 and the node N1; and the inverter I1 comprises four transistors: N-channel transistors T40, T41 and T42 and a P-channel transistor T45. Since the rest is the same as the configuration shown in FIG. 1, components identical with those shown in FIG. 1 are denoted by the same numerals as those used in FIG. 1 and no explanation is duplicated. In addition, since the function and operation of the third embodiment are the same as those of the first embodiment, their description is omitted.

In the case of the third embodiment, at a point of time the level of the electric potential at the node N2 turns to "H", the P-channel transistor T26 is turned off and, thereafter, no current flows to the transistor T21. Thus, the power consumption can be further reduced. If the driving power of the N-channel transistor T40 is reduced sufficiently by increasing the channel length thereof and decreasing its channel width, with the level of the clock signal P1 reset at "L", the electric potential of the node N1 at a point of time the electric potential of the node N2 changes from the "L" level to the "H" level can be raised. As a result, when the electric potential of the node N1 starts to drop, the electric potential of the node N2 changes from the "L" level to the "H" level fast, allowing the access time to be further reduced.

As described above, according to the third embodiment, since the transient change in electric potential at the node N1 is made faster, the memory device implemented by the third embodiment exhibits an effect of further reduction of the access time thereof.

Fourth Embodiment

In the case of the first embodiment, in order to enhance the accuracy of the memory-cell current, the four N-channel transistors T9 to T12 having the same channel length and the same channel width as the memory-cell transistor are connected in parallel to each other to form a configuration. In a case where the accuracy of the memory-cell current is not required, the configuration can be implemented by a single transistor having a channel width four times that of the memory-cell transistor. If the accuracy needs to be increased, on the contrary, the two N-channel transistors T7 and T8 with the same channel length and the same channel width as the N-channel transistors T1 and T30 can be connected to each other in parallel to form a configuration comprising a total of four transistors.

In addition, since the voltage drop across the N-channel transistor T8 is small, the transistor T8 can be eliminated. With the N-channel transistor T8 removed, the source of the N-channel transistor T7 is connected directly to the drain of the N-channel transistors T9 to T12, giving yet the same effects as the first embodiment.

In the case of the fourth embodiment, the number of word lines and the number of bit lines in the memory block MB1 are each set at four in order to make the explanation simple. It should be noted, however, that the numbers can be increased.

As described above, according to the fourth embodiment, the number of transistors employed in the memory device can be reduced. As a result, the memory device implemented by the fourth embodiment exhibits an effect of simplifying the configuration circuit.

What is claimed is:

1. A memory device comprising:
   a first source of current coupled to a first source of voltage for supplying a first electric potential;
   a first field-effect transistor with a drain thereof coupled to said first source of current;
   a second source of current connected to said drain for supplying a current during a first period;
   memory-cell field-effect transistors each connected to a second source of voltage for supplying a second electric potential lower than said first electric potential; a plurality of bit lines each connected to some of said memory-cell field-effect transistors; and
   select means connected to said bit lines for selecting one of said bit lines and for coupling said selected bit line to a source of said first field-effect transistor; and
   logic judging means for forming a judgment based on a logic value by comparison of the electric potential of said drain of said field-effect transistor with a predetermined value set between said first and second electric potentials during a second period in which said second source of current does not supply a current to said drain.

2. A memory device according to claim 1 wherein said some memory-cell field-effect transistors connected to one of said bit lines selected by said select means each draw a current from said selected bit line over said first and second periods.

3. A memory device according to claim 1 wherein a plurality of said memory-cell field-effect transistors are employed to constitute a NOR-type or NAND-type memory block.

4. A memory device according to claim 1 further including a third source of current and a third source of voltage comprising:

- a second field-effect transistor having a gate length equal to that of said first field-effect transistor, a gate width substantially equal to r times that of said first field-effect transistor where r is a positive real number and a drain as well as a gate thereof connected to said third source of current; and
- a third field-effect transistor having a gate length equal to that of each said memory-cell field-effect transistors, a gate width substantially equal to r times that of each of said memory-cell field-effect transistors, a drain thereof coupled to a source of said second field-effect transistor and a source thereof connected to said second electric potential, wherein said gate of said second field-effect transistor is connected to a gate of said first field-effect transistor.

5. A memory device according to claim 4 further comprising a first switching means connected between said first source of voltage and said first as well as third sources of current for switching a current supplied to said first as well as third sources of current.

6. A memory device according to claim 4 wherein a plurality of said memory-cell field-effect transistors are employed to constitute a NOR-type or NAND-type memory block.

7. A memory device according to claim 4 further comprising a second switching means inserted between said first source of current and said first field-effect transistor and also connected to an output of said logic judging means wherein said second switching means carries out switching operations in accordance with a signal output by said logic judging means.

8. A memory device according to claim 1 wherein a gate of said first field-effect transistor is held at said first electric potential.

* * * * *